United States Patent
Kim et al.

(10) Patent No.: US 7,622,940 B2
(45) Date of Patent: Nov. 24, 2009

(54) SEMICONDUCTOR DEVICE HAVING CONTACT FAILURE DETECTOR

(75) Inventors: Gwang-Young Kim, Gyeonggi-do (KR); Jong-Youb Kim, Seoul (KR); Boung-Lyoul Jung, Gyeonggi-do (KR); Joon-Su Ji, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/179,169

(22) Filed: Jul. 24, 2008

(65) Prior Publication Data

US 2009/0039909 A1 Feb. 12, 2009

(30) Foreign Application Priority Data

Aug. 7, 2007 (KR) ............ 10-2007-0079169

(51) Int. Cl.
*G01R 31/02* (2006.01)
*G01R 27/08* (2006.01)
(52) U.S. Cl. ............ 324/763; 324/713; 324/765; 324/158.1
(58) Field of Classification Search ........ 324/754–765
See application file for complete search history.

(56) References Cited

U.S. PATENT DOCUMENTS

| 3,783,375 | A | * | 1/1974 | Bennett | ............ 324/601 |
|---|---|---|---|---|---|
| 3,867,693 | A | * | 2/1975 | Saxenmeyer, Sr. | ............ 324/72.5 |
| 4,342,958 | A | * | 8/1982 | Russell | ............ 324/754 |
| 5,962,868 | A | * | 10/1999 | Tanida | ............ 257/48 |
| 7,474,106 | B2 | * | 1/2009 | Kanno | ............ 324/713 |
| 2002/0145440 | A1 | * | 10/2002 | Ohya et al. | ............ 324/763 |

FOREIGN PATENT DOCUMENTS

| JP | 2001-050996 | 2/2001 |
|---|---|---|
| JP | 2004-119774 | 4/2004 |
| KR | 10-0666176 | 1/2007 |

OTHER PUBLICATIONS

English language abstract of Japanese Publication No. 2001-050996.
English language abstract of Japanese Publication No. 2004-119774.
English language abstract of Korean Publication No. 10-0666176.

* cited by examiner

*Primary Examiner*—Ha Tran T Nguyen
*Assistant Examiner*—Emily Y Chan
(74) *Attorney, Agent, or Firm*—Marger Johnson & McCollom, P.C.

(57) ABSTRACT

A semiconductor device having a circuit for detecting a defective connection to the semiconductor device. A semiconductor device including multiple internal circuits; multiple pads respectively connected to the internal circuits; and a contact failure detector coupled between the pads and a common node and configured to detect contact failures between tips of a probe card and the pads.

18 Claims, 7 Drawing Sheets

SEMICONDUCTOR DEVICE HAVING CONTACT FAILURE DETECTOR

CROSS-REFERENCE TO RELATED PATENT APPLICATION

This application claims the benefit of Korean Patent Application No. 10-2007-0079169, filed on Aug. 7, 2007, in the Korean Intellectual Property Office, the disclosure of which is incorporated herein in its entirety by reference.

BACKGROUND

1. Technical Field

This disclosure relates to semiconductor devices, and more particularly, to a testing circuit and a method of detecting defective tips of a probe card and defective wire bonding.

2. Description of the Related Art

Generally, semiconductor devices are completed through semiconductor manufacturing processes such as manufacturing a semiconductor wafer, forming semiconductor chips on the semiconductor wafer, electrical die sorting (EDS) testing to check for failure of the semiconductor chips, packaging good semiconductor chips, and performing final testing of the packaged semiconductor chips, etc. The EDS testing is an operation to determine whether semiconductor chips formed on the semiconductor wafer are defective or not by applying electrical signals to semiconductor chips on a wafer. A tester and a probe card can be used for the EDS testing.

Figure 1:
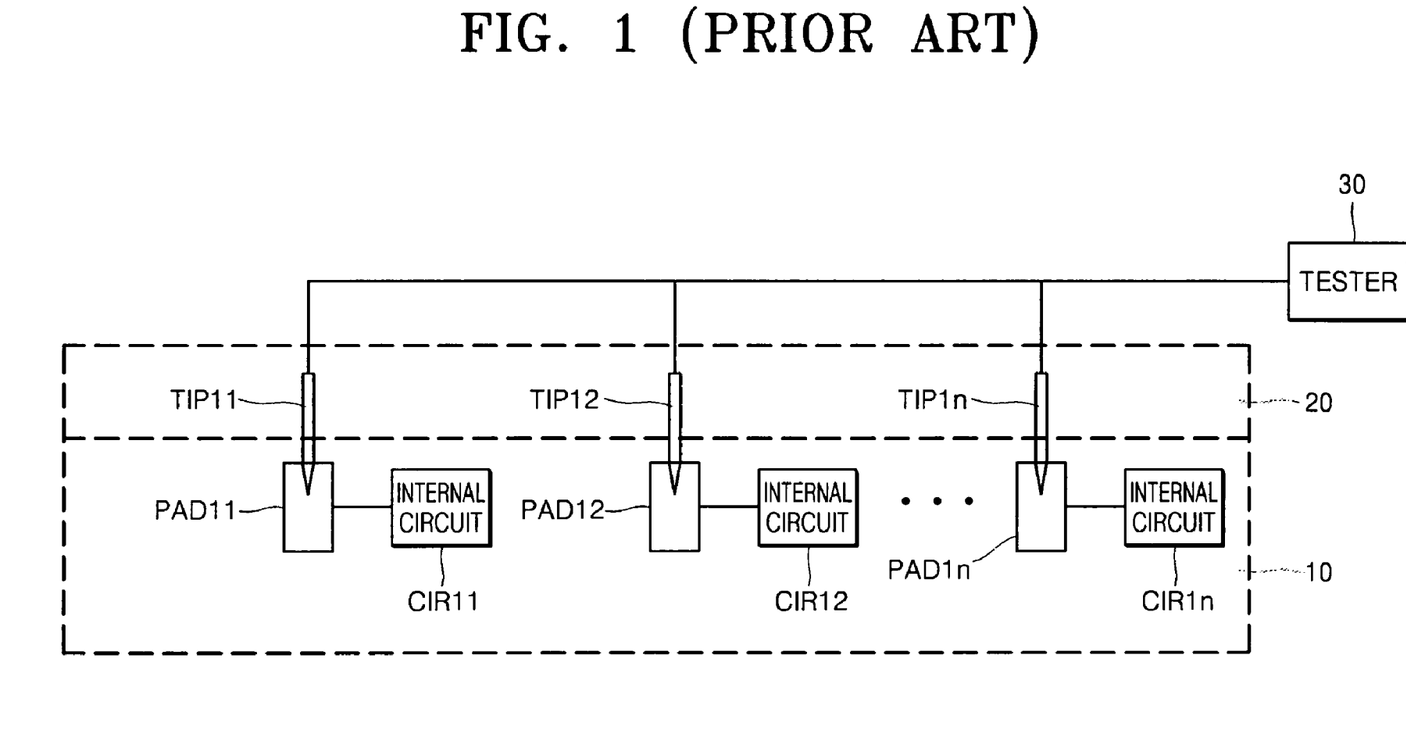
FIG. 1 is a diagram illustrating a method of testing a semiconductor device by using a conventional probe card.

FIG. 1 is a diagram illustrating a method of testing a semiconductor device by using a conventional probe card 20. The conventional probe card 20 includes probe tips TIP11 through TIP1$n$. A semiconductor device 10 includes pads PAD11 through PAD1$n$ (n being a natural number). The pads PAD11 through PAD1$n$ are electrically connected to internal circuits CIR11 through CIR1$n$ of the semiconductor device 10, respectively. When the EDS testing is performed using the conventional probe card 20, the pads PAD11 through PAD1$n$ are brought in contact with the probe tips TIP11 through TIP1$n$ of the conventional probe card 20, respectively. Testing signals are applied by the tester 30 via the conventional probe card 20 to the pads PAD11 through PAD1$n$ of the semiconductor wafer 10. Electrical characteristic signals are returned via the conventional probe card 20 to the tester 30 in order for the tester 30 to determine whether the semiconductor chips are defective.

During the EDS testing, if there is a contact failure between the pads PAD11 through PAD1$n$ of the semiconductor device 10 and the tips TIP11 through TIP1$n$ of the conventional probe card 20, any defects of the semiconductor device 10 cannot be detected accurately. Such contact failure can occurs when one or more of the tips TIP11 through TIP1$n$ are defective or when foreign substances are interposed between the pads PAD11 through PAD1$n$ and the tips TIP11 through TIP1$n$, respectively. If there is a contact failure, causes of the contact failure must be eliminated so that the conventional probe card 20 can normally perform the EDS testing.

However, when parallel testing is performed to improve manufacturing yield, it is very difficult to detect the defective tips of the tips TIP11 through TIP1$n$, because many tips TIP11 through TIP1$n$ are connected to the tester 30 in parallel as shown in FIG. 1. If the defective tips of the tips TIP11 through TIP1$n$ cannot be detected, testing cannot be performed properly, because the conventional probe card 20 cannot be readily repaired or replaced.

SUMMARY

An embodiment includes a semiconductor device having a circuit for detecting a defective connection to the semiconductor device. A semiconductor device including multiple internal circuits; multiple pads respectively connected to the internal circuits; and a contact failure detector coupled between the pads and a common node and configured to detect contact failures between tips of a probe card and the pads.

An embodiment includes a semiconductor device including a pad; a circuit coupled to the pad; a resistor coupled between the pad and a ground. A current flowing through the resistor indicates whether a connection to the pad is defective.

BRIEF DESCRIPTION OF THE DRAWINGS

The above and other features and advantages will become more apparent by describing embodiments in detail with reference to the attached drawings in which.

DETAILED DESCRIPTION

Embodiments will now be described more fully with reference to the accompanying drawings. Embodiments may take many different forms and should not be construed as being limited to the embodiments set forth herein; rather, these embodiments are provided so that this disclosure will be thorough and complete, and will fully convey the concepts to one skilled in the art. In the drawings, the thicknesses of layers and regions are exaggerated for clarity. Like reference numerals in the drawings denote like elements, and thus their description will be omitted.

Figure 2:
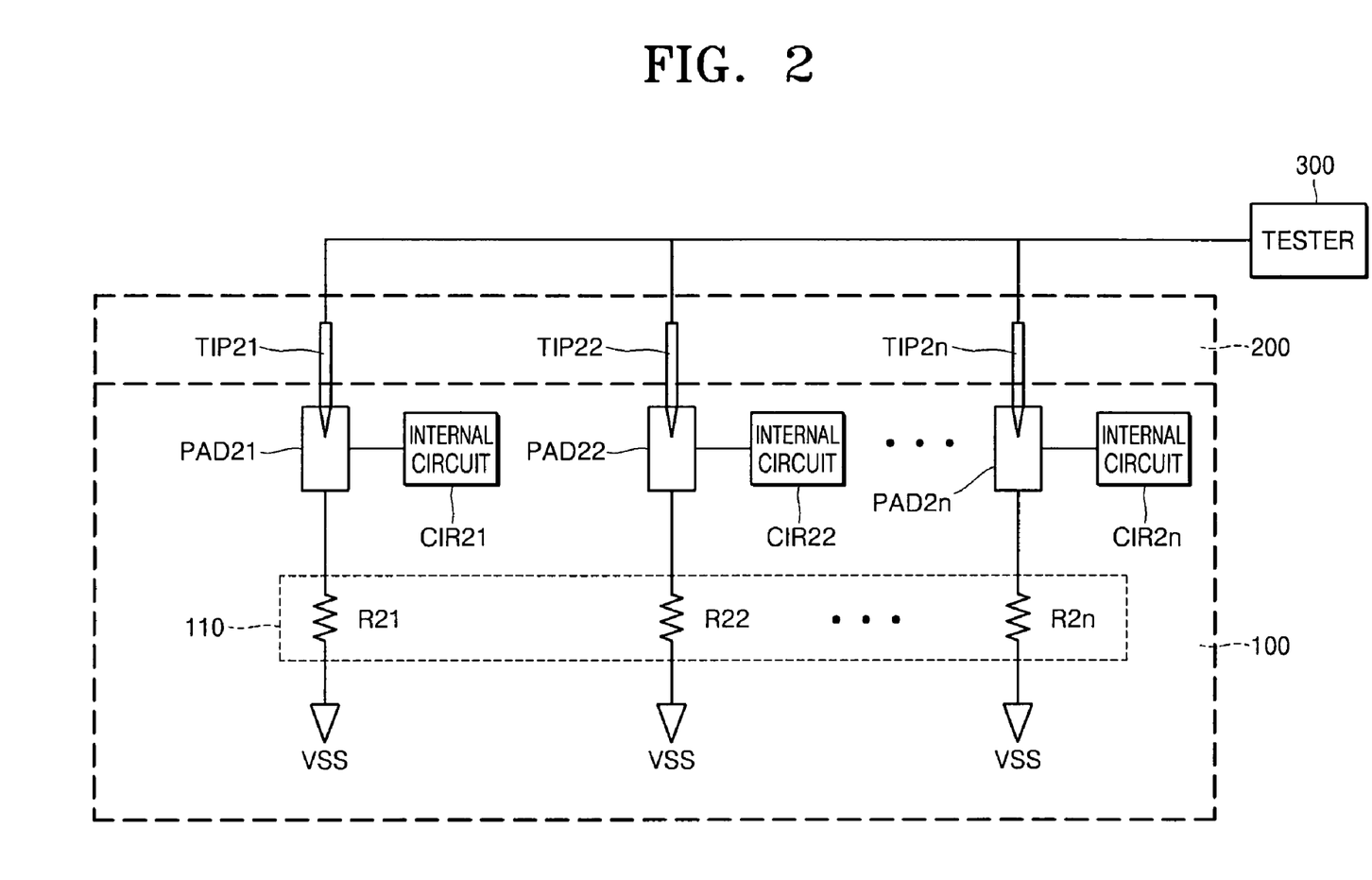
FIG. 2 is a diagram illustrating a contact failure detector in a semiconductor device according to an embodiment.

FIG. 2 is a diagram illustrating a contact failure detector in a semiconductor device according to an embodiment. The semiconductor device 100 can be disposed on a semiconductor wafer. The semiconductor device 100 includes pads PAD21 through PAD2$n$, where n is a natural integer. Although a single semiconductor device 100 on the semiconductor wafer will be described, any number of semiconductor devices can be disposed on the semiconductor wafer.

The pads PAD21 through PAD2$n$ are respectively electrically connected to internal circuits CIR21 through CIR2$n$ disposed respectively on the semiconductor chips. Tips TIP21 through TIP2$n$ of a probe card 200 can be brought in contact with the pads PAD21 through PAD2$n$. Since there can be multiple semiconductor devices 100 with corresponding pads PAD21 through PAD2$n$, the tops of the probe card 200 can be brought in contact with pads of multiple semiconductor devices 100. In particular, the probe card 200 can be brought in contact with pads of multiple semiconductor devices 100 simultaneously.

The semiconductor device 100 includes a contact failure detector 110. In an embodiment, the contact failure detector 110 can detect a contact failure between tips TIP21 through TIP2n and the pads PAD21 through PAD2n. The contact failure detector 110 includes resistors R21 through R2n, each of which is connected to a corresponding one of the pads PAD21 through PAD2n. In addition, each resistor R21 through R2n is connected to a ground; however, the resistors R21 through R2n can be connected to any common node.

Each of the resistors R21 through R2n can have resistance values different from each other. For example, if r stands for a resistance value of the resistor R21, the resistance values of the resistors R22 through R2n can be 2r through nr, respectively, where n is a natural integer. In another embodiment, the resistance values of resistors R22 through R2n can be $2r$ through $2^{(n-1)}r$ The resistors R21 through R2n may have resistance values increasing or decreasing at a any rate which is not limited to being doubled, and thus, may also be tripled, quadrupled, and so on.

The testing signals of a tester 300 are applied to the pads PAD21 through PAD2n of the semiconductor device 100 via the tips TIP21 through TIP2n of the probe card 20. Once the testing signals of a tester 300 are applied to the pads PAD21 through PAD2n, electrical characteristic signals are read by the tester 300 via the tips TIP21 through TIP2n in order to test defects in the semiconductor device 100.

When there is a contact failure between the pads PAD21 through PAD2n and the tips TIP21 through TIP2n, one or more of the defective tips may be detected by measuring electric currents flowing through the resistors R21 through R2n respectively connected to the pads PAD21 through PAD2n. If there are no contact failures between the pads PAD21 through PAD2n and the tips TIP21 through TIP2n, the values of the electric currents flowing through the tips TIP21 through TIP2n change at a rate according to resistance values of the resistors R21 through R2n of the contact failure detector 110. The values of electric currents flowing through the resistors R21 through R2n can be measured to ensure that there are no contact failures.

In contrast, if there are contact failures between the pads PAD21 through PAD2n and the tips TIP21 through TIP2n, the electric currents flowing through the resistors that are connected to one or more of the contact-failed pads from among the pads PAD21 through PAD2n, do not increase at a fixed rate. That is, the currents will be different than normal values where there are no contact failures. Accordingly, by measuring electric currents flowing through the resistors R21 through R2n and comparing the measured values with the normal values, contact failures can be detected.

In an embodiment, the currents through the resistors R21 through R2n can be measured by the tester 300. For example, the tester 300 can apply a voltage to the pads PAD21 through PAD2n through tips TIP21 through TIP2n. Given the resistance of resistors R21 through R2n and the applied voltage currents are expected to flow from the tester 300 through the resistors R21 through R2n. The tester 300 can measure these currents. If the current associated with a particular resistor of the resistors R21 through R2n is different from the expected value, the connection of the associated tip of the tips TIP21 through TIP2n to the semiconductor device 100 can be determined to be defective.

In another embodiment, a circuit (not shown) in the tester 300 can measure the currents passing through the resistors R21 through R2n. By comparing the currents measured by the circuit to expected values, defects in the connections between the tips TIP21 through TIP2n and the semiconductor device 100 can be determined.

Figure 3:
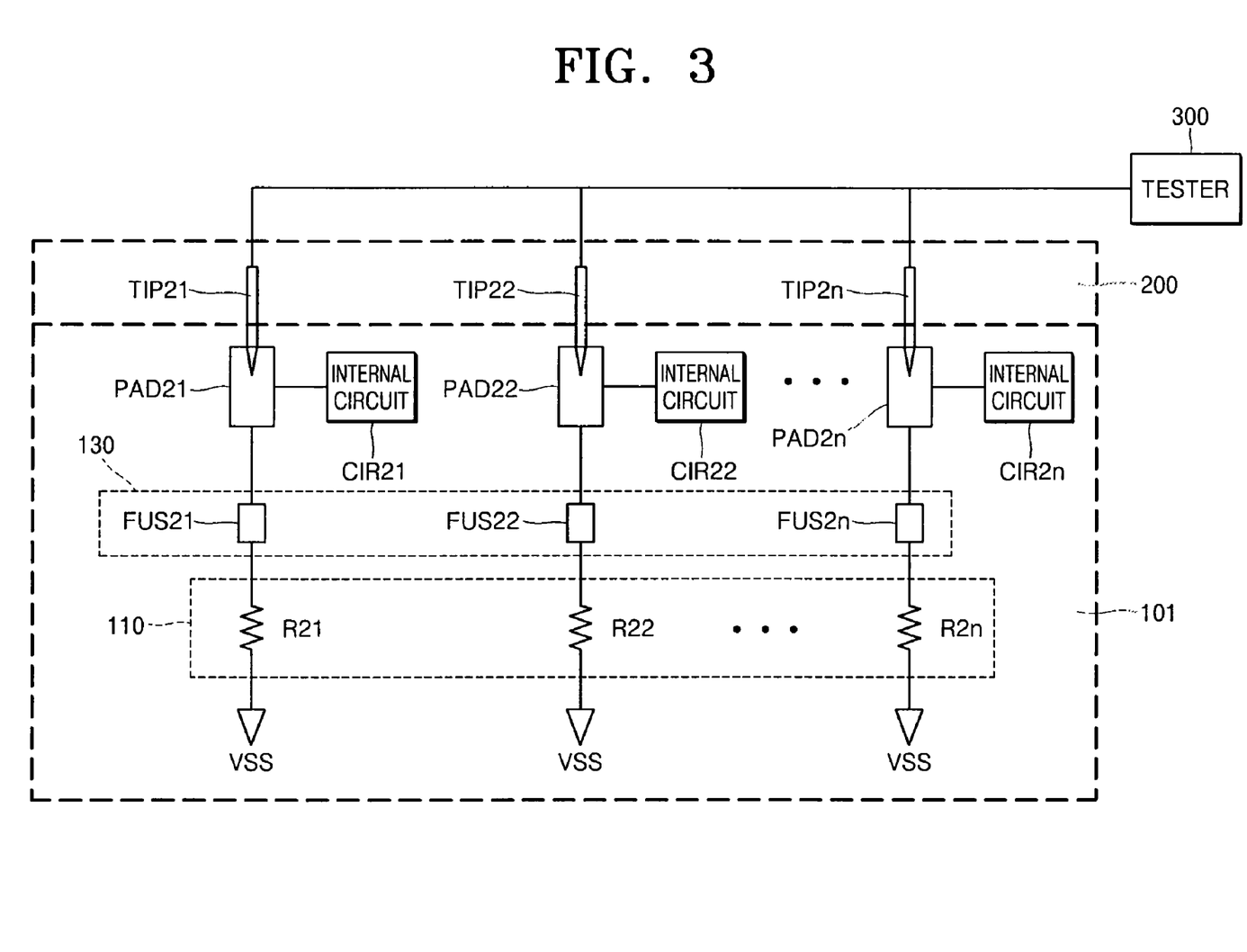
FIG. 3 is a diagram illustrating a contact failure detector in a semiconductor device according to another embodiment.

FIG. 3 is a diagram illustrating a contact failure detector 110 in a semiconductor device 101 according to another embodiment. The semiconductor device 110 of FIG. 3 is similar to the semiconductor device 100 of FIG. 2. However, the semiconductor device 101 includes a signal breaker 130.

The signal breaker 130 can prevent the resistors R21 through R2n from affecting the semiconductor device 101 after testing is completed.

The signal breaker is coupled between the pads PAD21 through PAD2n and the contact failure detector 110. The signal breaker 130 includes fuses FUS21 through FUS2n. Each of the fuses FUS21 through FUS2n is connected to a corresponding one of the pads PAD21 through PAD2n and a corresponding one of the resistors R21 through R2n. The fuses FUS21 through FUS2n can be electric fuses or laser fuses.

After testing is performed, the fuses FUS21 through FUS2n can either be blown by the appropriate technique. For example, applying a voltage greater than a fuse voltage or irradiating the fuses FUS21 through FUS2n with a laser can be performed, as appropriate. Accordingly, the blowout of the fuses FUS21 through FUS2n can prevent the resistors R21 through R2n from affecting the internal circuits CIR21 through CIR2n.

When there is a contact failure between the pads PAD21 through PAD2n and the tips TIP21 through TIP2n, the technique of detecting defective tips is similar as described with respect to FIG. 2, and thus, a description is omitted.

Figure 4:
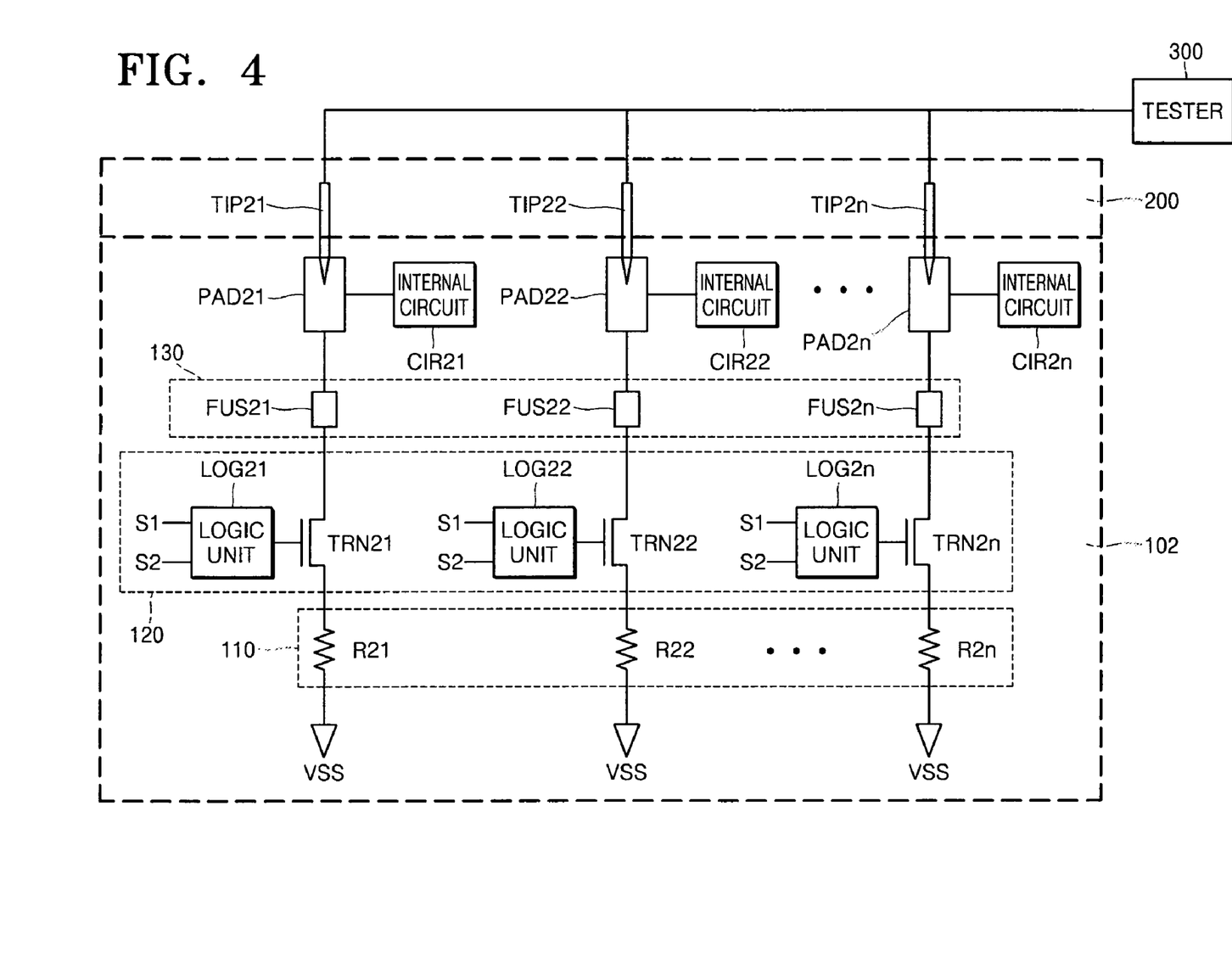
FIG. 4 is a diagram illustrating a contact failure detector in a semiconductor device according to another embodiment.

FIG. 4 is a diagram illustrating a contact failure detector 110 in a semiconductor device 102 according to another embodiment. The semiconductor device 102 is similar to the semiconductor device 101 described with reference to FIG. 3. However, the semiconductor device 102 includes a controller unit 120. The controller unit 120 can control the operations of the contact failure detector 110. In this embodiment, the controller unit 120 is coupled between the signal breaker 130 and the resistors R21 through R2n. However, the controller unit 120 can be coupled to the pads PAD21 through PAD2n without passing through the signal breaker 130. For example, the controller unit 120 can be coupled between the pads PAD21 through PAD2n and the signal breaker 130. In another example, the signal breaker 130 may not be present.

The controller unit 120 includes NMOS transistors TRN21 through TRN2n. Each of NMOS transistors TRN21 through TRN2n has a drain connected to a corresponding one of the fuses FUS21 through FUS2n and a source connected to a corresponding one of the resistors R21 through R2n. The controller unit 120 also includes logic units LOG21 through LOG2n to provide gate driving signals to gates of the NMOS transistors TRN21 through TRN2n.

Figure 5:
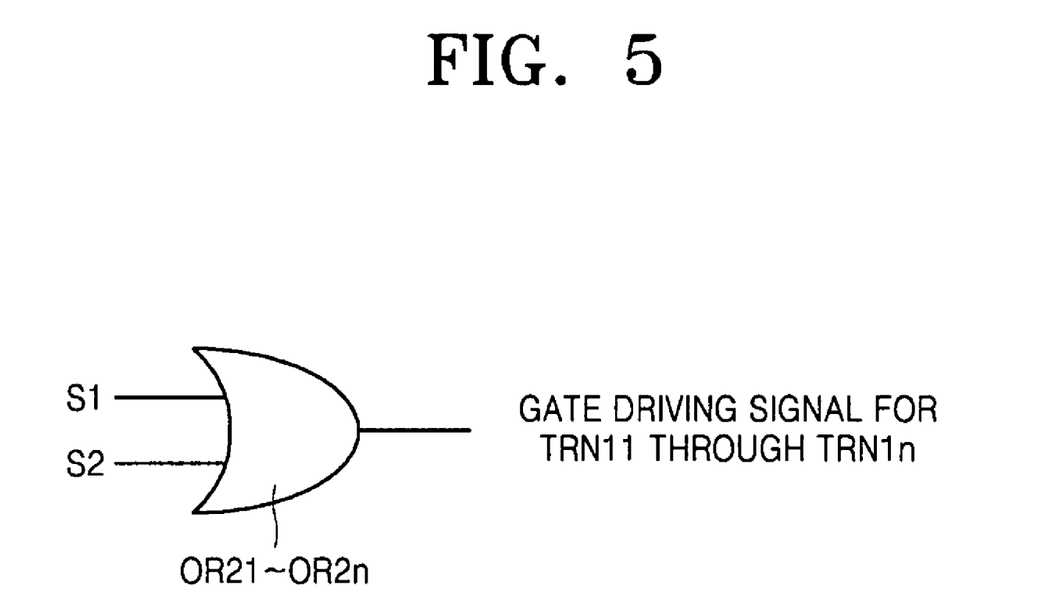
FIG. 5 is a detailed circuit diagram of an example of logic units of the semiconductor device shown in FIG. 4.

FIG. 5 is a detailed circuit diagram of an example of logic units LOG21 through LOG2n of the semiconductor device 102 shown in FIG. 4. The logic units LOG21 through LOG2n can include OR gates OR21 through OR2n. The OR gates OR21 through OR2n are configured to receive a first input signal S1 and a second input signal S2.

In an embodiment, the first input signal S1 is an input signal externally applied when the testing is being performed at a fabrication stage, and the second input signal S2 is an input signal externally applied when the testing is being performed in a packaging stage after a wafer is diced. For example, the second input signal S2 can be a mode register set (MRS) signal. However, embodiments are not limited to this example. The logic units LOG21 through LOG2n can include combinations of various logic gates, and various inputs to the logic gates to control the NMOS transistors TRN21 through TRN2n.

Using the OR gates OR21 through OR2n as an example, when both the first input signal S1 and the second input signal S2 are low signals, all outputs of the OR gates OR21 through OR2n change to low levels. When the outputs are applied to the gates of the NMOS transistors TRN21 through TRN2n, the NMOS transistors TRN21 through TRN2n do not operate.

That is, the electric connections between the resistors R21 through R2n and the internal circuits CIR21 through CIR2n are cut off regardless of whether the fuses FUS21 through FUS2n are blown.

In an embodiment, when the testing is being performed at a fabrication stage, the first input signal S1 can be input as a high level. When the testing is being performed at the packaging stage, the second input signal S2 can be input as a high level. When either the first input signal S1 or the second input signal S2 is a high level, the outputs of the OR gates OR21 through OR2n become high levels. As described above, the NMOS transistors TRN21 through TRN2n operate. As a result, a contact failure between tips TIP21 through TIP2n and the pads PAD21 through PAD2n can be detected by measuring a change of electric currents flowing through the resistors R21 through R2n.

Although the tester 300 has been described as applying signals to the pads PAD21 through PAD2n through a probe card 200, the contact failure detector 110 can be used in a variety of situations to test connections to the pads PAD21 through PAD2n. For example, when testing is performed in the packaging stage, the pads PAD21 through PAD2n may have been wire bonded to wires, terminals, contacts, or other similar structures of a package. However, there may be a defective connection between the pads PAD21 through PAD2n, the bond wires, the package, and the like. The contact failure detector 110 can detect connections to the pads PAD21 through PAD2n.

The detection of the connections that are defective due to the defective wire bonding, packaging, or the like can be determined in a similar manner as the detection of the defective tips that improperly contact with the pads PAD21 through PAD2n. When detecting a defective connection to the pads PAD21 through PAD2n at the packaging stage, the fuses FUS21 through FUS2n can be blown after testing is performed.

Figure 6:
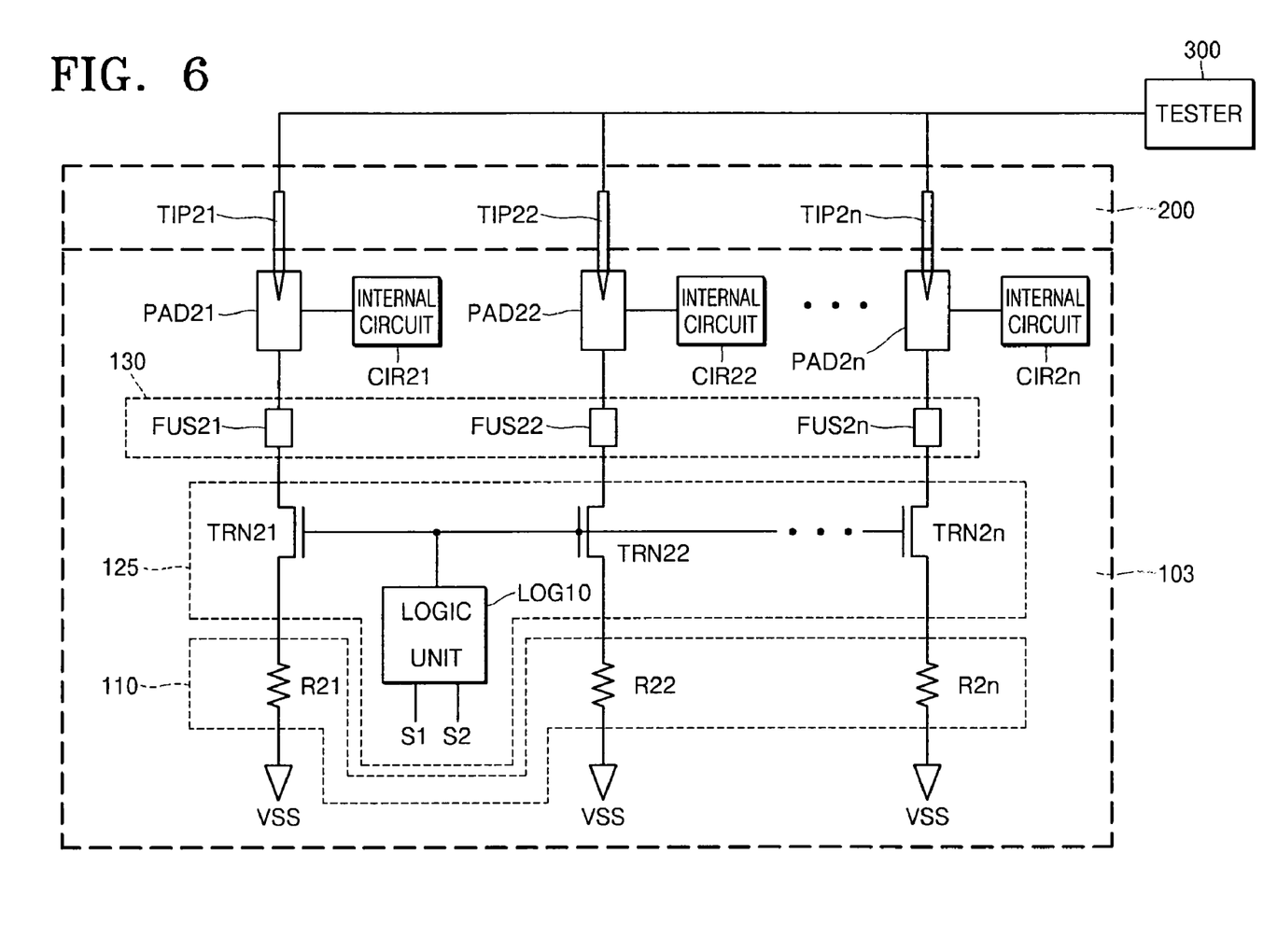
FIG. 6 is a diagram illustrating a contact failure detector in a semiconductor device according to another embodiment.

FIG. 6 is a diagram illustrating a contact failure detector 110 a semiconductor device 103 according to another embodiment. The semiconductor device 103 is similar to the semiconductor device 102 of FIG. 4. However, the semiconductor device 103 includes a controller unit 125 to control the operations of the contact failure detector 110.

The controller unit 125 is similar to the controller unit 120 of FIG. 4. However, the controller unit 125 includes only one logic unit LOG10. The logic unit LOG10 is connected in common to gates of the NMOS transistors TRN21 through TRN2n.

Figure 7:
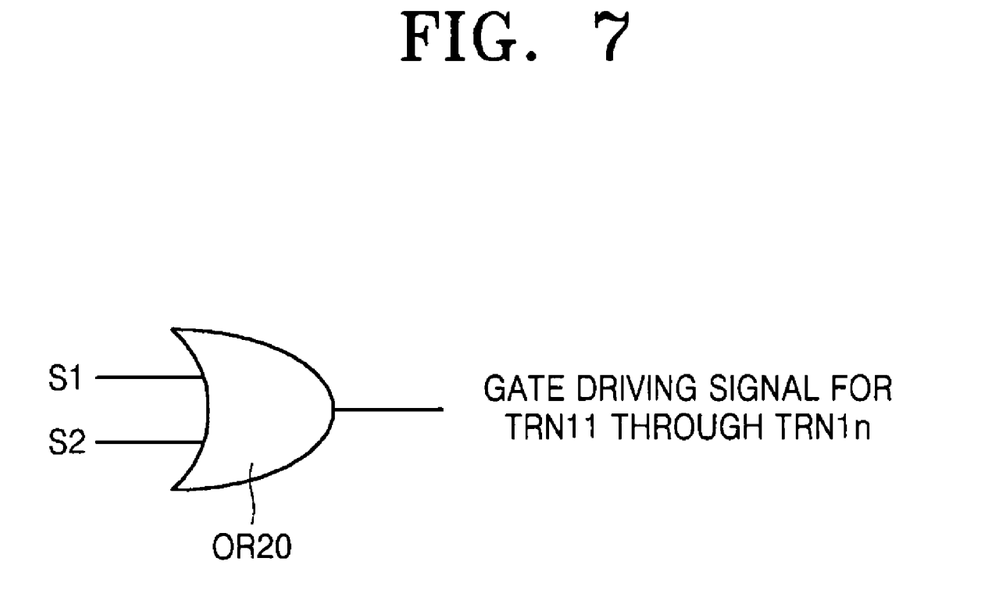
FIG. 7 is a detailed circuit diagram of an example of a logic unit of the semiconductor device shown in FIG. 6.

FIG. 7 is a detailed circuit diagram of an example of a logic unit of the semiconductor device shown in FIG. 6. The logic unit LOG10 can include an OR gate OR20 to receive the first input signal S1 and the second input signal S2. The operation of the logic unit LOG10 is similar to the operation of the logic units LOG21 through LOG2n shown in FIG. 5. In addition, similar to the logic units LOG21 through LOG2n, the logic unit LOG10 can also include combination of various logic gates. Since the NMOS transistors TRN21 through TRN2n can be operated by only one logic unit LOG10, the semiconductor device can be configured more simply in comparison to the semiconductor device 100 of FIG. 4.

Detecting a contact failure between the pads PAD21 through PAD2n and the tips TIP21 through TIP2n when testing is performed at the fabrication stage and the method of detecting a defective connection between the pads PAD21 through PAD2n and the wires can be performed similarly as described with reference to FIG. 4.

An embodiment includes a semiconductor device having a detector for detecting a contact failure either between pads and tips of a probe card or between pads and wires.

An embodiment includes a semiconductor device having a contact failure detector. The semiconductor device includes a semiconductor wafer having multiple pads respectively connected to internal circuits of the semiconductor device and the contact failure detector. The contact failure detector is disposed on the semiconductor wafer so that the contact failure detector is interconnected between the pads and ground, and detects a contact failure between tips of a probe card and the pads.

The semiconductor wafer can include multiple semiconductor chips. The pads can be respectively disposed on the semiconductor chips so that each of the pads is disposed on each of the semiconductor chips, or can be all disposed on the single semiconductor chip.

The contact failure detector can include multiple resistors, one end of each resistor is connected to each of the pads and another end of each resistor is connected to each of the ground connections. Each of the resistors can have different resistance values to each other, which vary by a fixed value.

In an embodiment, the semiconductor device further includes a signal breaker, which is disposed between the pads and the contact failure detector and prevents the resistors of the contact failure detector from affecting the internal circuits. The signal breaker can include multiple fuses, one end of each fuse is connected to each of the pads and another end of each fuse is connected to one of the resistors. The fuses of the signal breaker can either be blown by applying a voltage greater than a fuse voltage, be blown by irradiating laser onto the fuses, or blown by another appropriate technique, after detecting a contact failure between the tips of the probe card and the pads.

In an embodiment, the semiconductor device can further include a controller unit controlling signal transmissions from the tips of the probe card to the resistors of the contact failure detector. The controlling unit can include a plurality of NMOS transistors, which have drains, respectively connected to the pads, and sources, respectively connected to the resistors. Gate driving signals are respectively applied to gates of the NMOS transistors.

In an embodiment, the semiconductor device further includes a logic unit for providing the gate driving signals to the gates of the NMOS transistors. The logic unit can include multiple OR gates for transmitting the gate driving signals to the gates of the NMOS transistors after receiving a first input signal indicating that the testing is being performed at a fabrication stage or a second input signal indicating that the testing is being performed at the packaging stage. The logic unit can include an OR gate transmitting the gate driving signals to the gates of the NMOS transistors, which are connected in common, after receiving the first input signal or the second input signal. The fuses can be blown after detecting a defective connection at either the fabrication stage or the packaging stage.

An embodiment includes a method of detecting the defective connection of probe tips to a semiconductor device. First, tips of the probe card are brought in contact with the pads disposed on a plurality of the semiconductor chips disposed on the semiconductor wafer. Testing signals are applied via the tips of the probe card to perform parallel test of the semiconductor chips on the semiconductor wafer. If there is a contact failure between the tips and the pads, the defective tips of the tips are detected via the resistors, which are disposed on the semiconductor chips and are connected to the pads. The fuses, disposed on the semiconductor chips and connected between the resistors and the pads, can be blown to cut off signal transmission between the resistors and internal circuits disposed on the semiconductor chips.

An embodiment includes a method of detecting the defective packaging of a semiconductor device. First, a tester is brought in contact with a packaged semiconductor device. Testing signals are applied to perform parallel test of the semiconductor device in the package. If there is a contact failure between the package and the pads, the defective contact can be detected via the resistors as described above. The fuses, disposed on the semiconductor chips and connected between the resistors and the pads, can be blown to cut off signal transmission between the resistors and internal circuits disposed on the semiconductor chips.

While embodiments have been particularly shown and described with reference to the drawings, it will be understood by one of ordinary skill in the art that various changes in form and details may be made therein without departing from the spirit and scope as defined by the following claims.

What is claimed is:

1. A semiconductor device comprising:
   a plurality of internal circuits;
   a plurality of pads respectively connected to the internal circuits;
   a contact failure detector coupled between the pads and a common node and configured to detect contact failures of connections to the pads; and
   a controller unit coupled between the cads and the contact failure detector for selectively coupling the cads to the contact failure detector, the controller unit including:
      a plurality of transistors, each transistor coupled between a corresponding one of the pads and the contact failure detector; and
      at least one logic unit to apply at least one control signal to the transistors in response to a plurality of input signals.

2. The semiconductor device of claim 1, wherein the contact failure detector comprises a plurality of resistors, each resistor coupled between a corresponding one of the pads and the common node.

3. The semiconductor device of claim 2, wherein each of the resistors has a resistance value that is different from a resistance value of another resistor by a fixed amount.

4. The semiconductor device of claim 1, further comprising a signal breaker coupled between the pads and the contact failure detector.

5. The semiconductor device of claim 4, wherein the signal breaker comprises a plurality of fuses, each fuse coupled between a corresponding one of the pads and the contact failure detector.

6. The semiconductor device of claim 5, wherein each of the fuses is one of an electric fuse and a laser fuse.

7. The semiconductor device of claim 1, wherein:
   the at least one logic unit includes a plurality of logic units;
   the at least one control signal includes a plurality of control signals; and
   the logic units are configured to apply the control signals to the transistors.

8. The semiconductor device of claim 7, wherein:
   each logic unit comprises an OR gate to generate the corresponding control signal in response to a first input signal and a second input signal of the input signals;
   the first input signal indicates that a testing is being performed at a fabrication stage; and
   the second input signal indicates that the testing is being performed at a packaging stage.

9. The semiconductor device of claim 1, wherein the at least one logic unit includes a logic unit to apply a single control signal to the transistors.

10. A semiconductor device comprising:
    a pad;
    a circuit coupled to the pad;
    a resistor coupled between the pad and a ground;
    a transistor coupled between the resistor and the pad; and
    a logic unit coupled to the transistor and configured to apply a control signal to the transistor in response to a plurality of input signals;
    wherein a current flowing through the resistor indicates whether a connection to the pad is defective.

11. The semiconductor device of claim 10, further comprising a fuse coupled between the resistor and the pad.

12. The semiconductor device of claim 10, wherein the logic unit is configured to generate the control signal in response to a first input signal and a second input signal of the input signals.

13. The semiconductor device of claim 12, wherein the logic unit comprises an OR gate responsive to the first input signal and the second input signal.

14. The semiconductor device of claim 12, wherein:
    the first input signal indicates that a testing is being performed at a fabrication stage; and
    the second input signal indicates that the testing is being performed at a packaging stage.

15. A semiconductor device comprising:
    a plurality of internal circuits;
    a plurality of pads respectively connected to the internal circuits;
    a contact failure detector coupled between the pads and a common node and configured to detect contact failures of connections to the pads; and
    a signal breaker coupled between the pads and the contact failure detector;
    wherein the signal breaker comprises a plurality of fuses, each fuse coupled between a corresponding one of the pads and the contact failure detector.

16. The semiconductor device of claim 15, wherein each of the fuses is one of an electric fuse and a laser fuse.

17. A semiconductor device comprising:
    a plurality of internal circuits;
    a plurality of pads respectively connected to the internal circuits;
    a contact failure detector coupled between the pads and a common node and configured to detect contact failures of connections to the pads; and
    a controller unit coupled between the pads and the contact failure detector for selectively coupling the pads to the contact failure detector;
    wherein:
       the controller unit comprises a plurality of transistors, each transistor coupled between a corresponding one of the pads and the contact failure detector and a plurality of logic units to apply a plurality of control signals to the transistors;
       each logic unit comprises an OR gate to generate the corresponding control signal in response to a first input signal and a second input signal;
       the first input signal indicates that a testing is being performed at a fabrication stage; and
       the second input signal indicates that the testing is being performed at a packaging stage.

18. A semiconductor device comprising:
    a pad;
    a circuit coupled to the pad;
    a resistor coupled between the pad and a ground;
    a transistor coupled between the resistor and the pad; and
    a logic unit coupled to the transistor and configured to apply a control signal to the transistor;

wherein:
  a current flowing through the resistor indicates whether a connection to the pad is defective;
  the logic unit is configured to generate the control signal in response to a first input signal and a second input signal;
  the first input signal indicates that a testing is being performed at a fabrication stage; and
  the second input signal indicates that the testing is being performed at a packaging stage.

* * * * *

UNITED STATES PATENT AND TRADEMARK OFFICE
CERTIFICATE OF CORRECTION

PATENT NO. : 7,622,940 B2
APPLICATION NO. : 12/179169
DATED : November 24, 2009
INVENTOR(S) : Gwang-Young Kim et al.

It is certified that error appears in the above-identified patent and that said Letters Patent is hereby corrected as shown below:

Column 7, line 20, the word "cads" should read -- pads --;
Column 7, line 21, the word "cads" should read -- pads --.

Signed and Sealed this

Sixteenth Day of March, 2010

David J. Kappos
*Director of the United States Patent and Trademark Office*